United States Patent [19]

Graham

[11] 4,195,997
[45] Apr. 1, 1980

[54] PHOTOPOLYMERIZABLE COMPOSITIONS CONTAINING SELECTED CELLULOSE ACETATE BUTYRATE AS A BINDER

[75] Inventor: Boynton Graham, Wilmington, Del.

[73] Assignee: E. I. Du Pont de Nemours and Company, Wilmington, Del.

[21] Appl. No.: 871,683

[22] Filed: Jan. 23, 1978

[51] Int. Cl.² .............................................. G03C 1/68
[52] U.S. Cl. .................................. 430/286; 430/306; 430/314
[58] Field of Search ................... 96/115 P, 67, 35.1; 260/17 A

[56] References Cited

U.S. PATENT DOCUMENTS

| 3,479,185 | 11/1969 | Chambers | 96/84 |
| 3,558,322 | 1/1971 | Fan | 96/115 R |
| 3,784,378 | 1/1974 | Gramas | 96/27 E |
| 4,058,443 | 11/1978 | Murata et al. | 96/115 P |

FOREIGN PATENT DOCUMENTS 1347680  2/1974  United Kingdom ............... 96/115 R

*Primary Examiner*—J. Travis Brown

[57] ABSTRACT

Photopolymerizable compositions or layers containing an ethylenically unsaturated compound, a photoinitiator or photoninitiator system, and at least one polymeric binder, at least half of the binder being cellulose acetate butyrate having a composition of 44 to 50 weight percent butyryl, 5.0 to 8.5 weight percent acetyl and 0.5 to 1.0 weight percent hydroxyl. The use of the specific cellulose acetate butyrates in photopolymerizable compositions improves cold flow resistance and processability, i.e., development. The compositions and layers are particularly useful in preparing dry film photoresists and solder masks.

6 Claims, No Drawings

PHOTOPOLYMERIZABLE COMPOSITIONS CONTAINING SELECTED CELLULOSE ACETATE BUTYRATE AS A BINDER

DESCRIPTION

TECHNICAL FIELD

This invention relates to photopolymerizable compositions and elements, and more particularly relates to such compositions and elements which contain selected cellulose acetate butyrate compounds as a binder.

BACKGROUND ART

Photopolymerizable compositions and elements are well known in the art. These photopolymerizable compositions contain, inter alia, at least one photopolymerizable monomer, a photoinitiator or photoinitiator system, and at least one binder. Among suitable binder components for photopolymerizable compositions it is known to use cellulose acetate butyrate, generally without specifying a specific composition thereof. Specific cellulose acetate butyrate compounds have been disclosed in some U.S. Patents, e.g., U.S. Pat. No. 3,784,378 which discloses a compound having 17 percent butyryl, 29.5 percent acetyl and 1.5 percent hydroxyl; U.S. Pat. No. 3,479,185 which discloses a compound having 26 percent butyryl, 20.5 percent acetyl and 2.5 percent hydroxyl; and U.S. Pat. No. 3,558,322 which discloses a compound having 37 percent butyryl, 13 percent acetyl and 2 percent hydroxyl.

Photopolymerizable compositions as photoresists have been described in U.S. Pat. No. 3,469,982. Photopolymerizable compositions prior to exposure are generally soft, malleable and easily deformable. When photopolymer compositions are exposed to actinic radiation they polymerize and become insoluble in certain solvents called developers. The image which remains after development is not affected by chemical action of baths or solutions used in making photoresists. However, before exposure to actinic radiation these soft compositions can exhibit cold flow, that is, continuing and permanent deformation of the photopolymer under its own weight or under a uniform or nonuniform force such as being wound on rolls or being moved through a lamination process as described in U.S. Pat. No. 3,984,244. Cold flow is highly objectionable since, for example, on storage in rolls cold flow can occur causing edges of the film to fuse together, lap to lap. If dirt or lint particles inadvertently get wound between the laps at manufacture, the localized pressure spots created cause the photopolymer to flow, leading to thin spots in the photopolymer layer which will ultimately produce pinholes in printed circuit manufacture. During lamination at elevated temperatures, soft films flow excessively at the temperatures required to develop proper adhesion to the surface on which the lamination is made leading to distortions in the laminated coating in the form of ripples of alternating thick and thin areas. Other defects may occur from the heat and pressure during imagewise exposure. Edges of the image-bearing photographic film or masking material emboss the photopolymer creating thin areas.

DISCLOSURE OF INVENTION

In accordance with this invention, improved photopolymerizable compositions are provided which comprise (a) at least one addition polymerizable ethylenically unsaturated compound having a boiling point greater than 100° C. at normal pressure; (b) an organic, free-radical generating addition polymerization initiator or initiator system activatable by actinic radiation in the ultraviolet to visible region of the spectrum; and (c) 25 to 90 percent by weight, based on the weight of the photopolymerizable composition, of at least one macromolecular organic polymeric binder, the improvement being that at least half of the binder component is cellulose acetate butyrate containing 44 to 50 weight percent butyryl groups, 5.0 to 8.5 weight percent acetyl groups and 0.5 to 1 percent hydroxyl groups.

The photopolymerizable compositions of this invention are composed of 10 to 30 parts by weight photopolymerizable monomer, 0.1 to 10 parts by weight photoinitiator and 25 to 90.0 parts by weight binder. Optional useful ingredients such as thermal inhibitors, colorants, plasticizers, fillers, flame retardants can be present in amounts from 0.1 to 60 parts by weight, based on the total weight of the composition. The components must be capable of being formed into coherent dry layers.

Suitable photopolymerizable monomers which can be used as the sole monomer or in combination with others are nonvolatile, i.e., have a boiling point greater than 100° C. at normal pressure, compatible, polyfunctional acrylates or methacrylates such as the following: t-butyl acrylate, 1,5 pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4 cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di(p-hydroxyphenyl)-propane dimethacrylate, di-(3-methacryloxy-2-hydroxypropyl) ether of bisphenol-A, di(2-methacryloxyethyl) ether of bisphenol-A, di(3-acryloxy-2-hydroxypropyl) ether of bisphenol-A, di-(2-acryloxyethyl) ether of bisphenol-A, di-(3-methacryloxy-2-hydroxypropyl) ether of tetrachloro bisphenol-A, di(2-methacryloxyethyl) ether of tetrachloro bisphenol-A, di-(3-methacryloxy-2-hydroxypropyl) ether of tetrabromo bisphenol-A, di(2-methacryloxyethyl) ether of tetrabromo bisphenol-A, di-(3-methacryloxy-2-hydroxypropyl) ether of 1,4-butane diol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

Also useful in the photopolymerizable layer is at least one of the following ethylenically unsaturated compounds having a molecular weight of at least 300. Preferred monomers of this type are: an alkylene or a polyalkylene glycol diacrylate prepared from an alkylene glycol of 2 to 15 carbon atoms or a polyalkylene ether glycol of 1 to 10 ether linkages, and those disclosed in U.S. Pat. No. 2,927,022, e.g., those having a plurality of addition polymerizable ethylenic linkages particularly when present as terminal linkages and especially those wherein at least one and preferably most of such linkages are conjugated with a double bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free-radical generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthaquinone, 9,10-phenanthrenequinone, 1,2-benzanthraquinone, 2,3-benzanthraquinone, 2-methyl-1,4 naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a) anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon substituted aromatic acyloins, including α-methylbenzoin, α-allylbenzoin and-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's Ketone, benzophenone, 2,4,5-triphenylimidazolyl dimers with hydrogen donors, and mixtures thereof as described in U.S. Pat. Nos. 3,427,161; 3,479,185 and 3,549,367, can be used as initiators.

Other useful additives include thermal inhibitors, flame retardants, colorants, plasticizers, fillers, etc. Some of the ingredients can act in a dual role. For example, the ethylenically unsaturated photopolymerizable compound or the flame retardant can also act as a plasticizer for the thermoplastic binder.

Thermal polymerization inhibitors that can be used in minor amount in photopolymerizable compositions include: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil.

Flame retardants or flame resistant additives that can be used in the photopolymerizable compositions are for example, tris-1,2-dibromopropyl phosphate, chlorinated polymeric phosphate

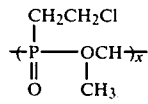

tetrabromobisphenol A, allyl bis(1,2-dibromopropyl) phosphate, hexachloroendomethylenetetrahydrophthalic acid, 70 percent chlorinated paraffin, tris(beta chloroethyl) phosphate, tris(dichloropropyl) phosphate, chlorinated biphenyl, $Sb_2O_3$, decabromophenol ether, 40 percent chlorinated paraffin, chlorinated phosphate, tetra(2-cyano ethyl) phosphine bromide, brominated alkyl borate, nitrogen-modified aluminum phosphate, ammonium polyphosphate, methyl phosphonamide, bis glycol ether of tetrabromobisphenol A, hexakis (parabromophenoxy) cyclo triphosphezine, octabromodiphenyl, tetrabromo pentyl alcohol, 68 percent chlorinated biphenyl triphenyl antimony, and cyclohexane phosphonic acid ester of parabromo phenol.

Various dyes and pigments may be added to increase the visibility of the resist image. Any colorant used, however, should preferably be transparent to the actinic radiation used. Plasticizers and fillers that can be used in the compositions are known in the art.

The photopolymerizable compositions of this invention can be made using a binder system consisting of at least 50% by weight thereof of cellulose acetate butyrate binders such as are illustrated in Examples 1 and 2. Suitable other binders in amounts up to 50% by weight based on the weight of the binder system are, for example, acrylates; polyurethanes; polyesters; epoxides; polyvinyl compounds; synthetic rubbers, e.g., copolymers of methyl methacrylate/acrylonitrile/butadiene/and styrene, polyamides; polycarbonates; polyvinyl acetal; polyformaldehydes, etc. Preferred binders are compatible with the cellulose acetate butyrate binder.

BEST MODE FOR CARRYING OUT THE INVENTION

The best mode is illustrated in Example 3 wherein the defined composition in layer form is laminated to a circuit board and a soldered printed circuit is made. The resist layer showed excellent resistance to cold flow, rapid photospeed and development.

INDUSTRIAL APPLICABILITY

The radiation-sensitive photopolymerizable compositions are useful as photoresists and solder masks. A solder mask is a protective coating which is selectively applied to portions of a printed circuit board surface to confine solder to pad areas on the board and to prevent bridging between conductors during tinning operations and during soldering of components. A solder mask also functions to prevent or minimize corrosion of the bare copper conductors and as a dielectric to insulate certain components from adjacent circuitry. Since a solder mask remains on the finished circuit board, it usually is transparent to allow for ease of circuit inspection.

Preferably the photopolymerizable compositions are in the form of a layer having a thickness of about 0.0003 inch (0.0008 cm) to about 0.01 inch (0.025 cm) and being adhered with low to moderate adherence to a thin, flexible, polymeric film support which transmits radiation actinic to the photopolymerizable layer. The opposite side of the photopolymerizable layer may have adhered thereto a protective cover sheet having less adherence to the layer than the adherence between the film support and the layer.

A suitable strippable film support which preferably has a high degree of dimensional stability to temperature changes, can be chosen from a wide variety of films composed of high polymers, e.g., polyamides, polyolefins, polyesters, vinyl polymers, and cellulose esters, and can have a thickness of from 0.00025 inch (~0.0006 cm) to 0.008 inch (~0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film having a thickness of about 0.001 inch (~0.0025 cm).

A suitable removable, protective, cover sheet can be chosen from the same group of high polymer films described above and can have the same wide range of thicknesses. A cover sheet of 0.001 inch (~0.0025 cm) thick polyethylene is especially suitable. Supports and cover sheets as described above provide good protection to the photopolymerizable resist layer.

Only elements having layers containing cellulose acetate butyrates having a composition 44-50 percent butyryl, 5-9.5 percent acetyl and 0.5-1.0 percent hydroxyl have been found to exhibit good resistance to cold flow. In addition to this unexpected and surprising result, it was discovered that photopolymerizable elements having a cellulose acetate butyrate binder wherein the butyryl content of the cellulose acetate butyrate was less than 44 percent had excessively long development times in organic solvents. On the other hand, photopolymerizable elements having binders of this invention showed good development times in the same solvent. A further advantage of the defined cellulose acetate butyrate binders is that they can tolerate unusually large amounts of plasticizers, monomers or flame retardants without becoming tacky or giving intolerable cold flow. Furthermore, photopolymerizable elements having the binders of this invention when used as a solder mask exhibit good photospeed and good resistance to solder and solvents. Some elements having binders of this invention also did not require a post development heat treatment curing step as frequently practiced in the industry.

EXAMPLES

The following examples illustrate the invention wherein the percentages are by weight. In these examples the coating solutions are prepared by thoroughly mixing the indicated ingredients and, if desired, ball milling the resultant dispersion. After preparation, the dispersion is coated on 0.001 inch (0.0025 cm) thick polyethylene terephthalate so that the dried coating is about 0.0034 inch (0.0086 cm) thick. Placed over the dried coating is a 0.001 inch (0.0025 cm) thick cover sheet of polyethylene. Qualitative tests for cold flow are made by estimating the imprint of a paper clip on unirradiated film after standing for 24 hours at room temperature.

Exposure tests are conducted as follows: films are laminated to preheated copper-clad phenolic or epoxy-filled Fiberglass boards and are exposed imagewise through a √2 step wedge pattern to radiation from a pulsed xenon source, the output of the exposure source being 2000 watts, and the distance from the source to the exposure plane being 15.75 inch (40 cm); and the coatings are then developed at room temperature with methyl chloroform. The results of the cold flow resistance and exposure/development tests are set forth in the examples below.

EXAMPLE 1

The cellulose acetate butyrate compounds listed in Table I as Samples a to m are used in this example.

TABLE I

| Sample | % Acetyl[1] | % Butyryl | % Hydroxyl |
|---|---|---|---|
| a | 5.0 | 49.0 | 0.5 |
| b | 5.0 | 49.0 | 0.9 |
| c | 8.5 | 44.0 | 1.0 |
| d | 2.0 | 53.0 | 1.6 |
| e | 2.0 | 53.0 | 1.6 |
| f | 3.0 | 50.0 | 2.0 |
| g | 13.5 | 37.0 | 2.0 |
| h | 13.5 | 37.0 | 1.5 |
| i | 13.5 | 37.0 | 2.0 |
| j | 20.5 | 26.0 | 2.0 |
| k | 29.5 | 17.0 | 1.3 |
| l | 29.5 | 17.0 | 1.5 |
| m | 4.0 | 55.0 | 3.0 |

[1]Acyl content is determined by ASTM D-817-65.

| | Viscosity[2] | |
|---|---|---|
| | Seconds | Posies |
| a | 0.8-1.2 | 3.0-4.5 |
| b | 4.0-6.0 | 15.0-22.5 |
| c | 1.0-2.0 | 3.8-7.6 |
| d | 0.08-0.15 | 0.28-0.57 |
| e | 0.15-0.30 | 0.57-1.15 |
| f | 1.0-2.0 | 3.8-7.6 |
| g | 0.07-0.16 | 0.27-0.61 |
| h | 0.3-0.5 | 1.15-2.05 |
| i | 17.0-28.0 | 64.0-105.0 |
| j | 15.0-35.0 | 56.0-131.0 |
| k | 22.0-30.0 | 81.0-115 |
| l | 31.0-40.0 | 115.0-188.0 |
| m | 0.20-0.40 | 0.7-1.5 |

[2]Viscosity is determined by ASTM D-817-65.(Formula) and D-1343-56.

Coating Solutions 1 to 13 are prepared by dissolving 15.2 g of the particular cellulose acetate butyrate Samples a to m, respectively, and 8.0 g of pentaerythritol triacrylate, in 49.2 g of methylene chloride, followed by adding 0.8 g of tert-butyl anthraquinone initiator, 16.0 g of tris-(2,3-dibromopropyl) phosphate, 4.08 g of a pigment Dispersion A, a 10.2 percent dispersion in methylene chloride of Monastral Green, a phthalocyanine pigment, and 11.34 g of a copolymer of methyl methacrylate (46 percent), acrylonitrile (9 percent), butadiene (14 percent) and styrene (31 percent), and ball milling. Each composition is coated and tested as described above. As noted in Table II the cold flow resistance of photopolymerizable compositions using the binder of this invention is markedly superior to those compositions using cellulose acetate butyrate binders of compositions outside the scope of the invention.

Table II

| Coating Solutions | Sample | Cold Flow Resistance |
|---|---|---|
| 1 | a | Very Good |
| 2 | b | Excellent |
| 3 | c | Good |
| 4 | d | Poor |
| 5 | e | Poor |
| 6 | f | Poor |
| 7 | g | Poor |
| 8 | h | Poor |
| 9 | i | Poor |
| 10 | j | Poor |
| 11 | k | Poor |
| 12 | l | Poor |
| 13 | m | Poor |

EXAMPLE 2

Photopolymerizable compositions with binders of this invention are particularly useful as a dry film photosensitive solder mask to protect printed circuit boards.

Layers of the photopolymer compositions of Example 1 are laminated to pumice-cleaned preheated copper/phenolic or glass-epoxy circuit board with a plurality of raised copper circuit lines by means of cold rollers, holding the laminates two to five minutes in an oven at 120° C. and again running through cold rollers. The supported side of the photopolymerizable element is exposed to ultraviolet radiation imagewise through a $\sqrt{2}$ wedge pattern, and the support is removed. Alternatively, the support can be removed prior to exposure. The unexposed areas are removed by washing them with methyl chloroform solvent which removes only the unexposed, unpolymerized areas and not the exposed, polymerized areas. Electrical components are then added to the board with their wire leads bent over the appropriate circuit lines in the areas from which the areas of unexposed photopolymer have been removed. After 24 hours at room temperature, the laminates are immersed for 10 seconds in a solder eutectic composition, 60 percent tin and 40 percent lead, at 260° C. Samples are then examined for a variety of physical properties including resistance to blistering, resistance to hot solder, loss of adhesion between the photopolymer layer and circuit board, resistance to aqueous and organic fluxes, and resistance to hot and cold degreasing solvents.

Samples of Coating Solutions 1 to 3 of Table II are suitable for use as dry photosensitive solder masks. Due to poor cold flow, samples of Coating Solutions 4 to 8 are not useful as a dry photosensitive solder mask. Samples of Coating Solutions 9 to 13 are not developable in five minutes and therefore, are not tested as solder masks. In addition, those coatings made with the cellulose acetate butyrate binders of this invention exhibit rapid development and photospeed, as measured by the number of $\sqrt{2}$ steps developed at constant exposure of glass/epoxy circuit boards. Furthermore, laminates made from Coating Solutions 1 to 3 do not require a post development heat treatment curing step to obtain good solder resist properties.

EXAMPLE 3

The following photopolymerizable composition is prepared as described in Example 1.

| | |
|---|---|
| Cellulose of Acetate Butyrate, Sample a of Example 1 | 84.75 g |
| Pentaerythritol triacrylate | 75.00 g |
| Tert-butyl anthraquinone | 5.00 g |
| Tris(2,3-dibromopropyl) phosphate | 250.00 g |
| Methyl methacrylate/acrylonitrile/butadiene/styrene copolymer of Example 1 | 83.25 g |
| Dispersion A of Example 1 | 10.00 g |
| Methylene Chloride | 564 g |

This solution is extrusion coated onto a 0.001 inch (0.0025 cm) thick polyethylene terephthalate support through a 0.030 inch (0.0762 cm) die, is dried by passing at 2 feet/minute (0.6096 meters/minute) through a 12 foot (3.66 meter) zone at 160° C., and is laminated at windup to 0.001 inch (0.0025 cm) thick polyethylene. The dry coating thickness is 0.0045 inch (0.0114 cm).

For use as a solder mask these coatings are laminated to circuit boards exposed, developed and tested as described in Example 2. The exposure is for three minutes and development for one minute. Also, the element is a post exposure cured at 149° C. for 30 minutes. This photopolymerizable composition is useful as a dry film solder mask.

EXAMPLE 4

The following photopolymerizable composition is prepared as described in Example 3.

| | |
|---|---|
| Cellulose acetate butyrate, Sample a of Example 1 | 2.76 g |
| Pentaerythritol triacrylate | 4.00 g |
| Tert-butyl anthraquinone | 0.40 g |
| Tris (2,3-dibromopropyl) phosphate | 6.00 g |
| Methyl methacrylate (95%)/ ethyl acrylate (5%) copolymer | 2.76 g |
| Phosgard ® C22R, a polymeric chlorinated phosphonate | 4.00 g |
| Dispersion A of Example 1 | 1.00 g |
| Methylene Chloride | 24.00 g |

This solution is coated, dried, laminated, exposed, developed and tested as described in Example 3. This photopolymerizable composition is useful as a dry film solder mask.

EXAMPLE 5

The following photopolymerizable composition is prepared as described in Example 2.

| | |
|---|---|
| Cellulose acetate butyrate, Sample a of Example 1 | 14.0 g |
| Pentaerythritol triacrylate | 8.0 g |
| Tris (2,3-dibromopropyl) phosphate | 16.0 g |
| Bis(2-O-chlorophenyl-4,5-diphenyl) imidazole | 1.60 g |
| 2-Mercaptobenzthiazole | 0.16 g |
| Dispersion A of Example 1 | 2.0 g |
| Methylene Chloride | 49.2 g |

This composition is coated, dried, laminated, exposed, developed and tested as described in Example 2. This photopolymerizable composition is useful as a dry film solder mask.

EXAMPLE 6

Ten coating solutions are prepared according to the procedure described in Example 1 except that in place of the pentaerythritol triacrylate 8.0 g of one of the following ethylenically unsaturated compounds is used:
triethylene glycol diacrylate,
trimethylolpropane triacrylate,
trimethylolpropane trimethacrylate,
decamethylene glycol diacrylate,
decamethylene glycol dimethacrylate,
triethylene glycol dimethacrylate,
hexamethylene glycol diacrylate,
hexamethylene glycol dimethacrylate,
polyethylene glycol diacrylate, and
triacrylate of ethoxylated trimethylolpropane.
After coating the above solutions on polyethylene terephthalate film as described above, qualitative tests for cold flow are made. All give low cold flow and sharp, well developed images.

I claim:

1. An element comprising a polymeric film support and a photopolymerizable composition in the form of a layer on said polymeric film support and having low to moderate adhesion thereto, said composition comprising
   (a) at least one addition polymerizable ethylenically unsaturated compound having a boiling point greater than 100° C. at normal pressure;
   (b) an organic, free radical generating addition polymerization initiator or initiator system activatable by actinic radiation in the ultraviolet to visible region of the spectrum; and
   (c) 25 to 90 percent by weight, based on the weight of the photopolymerizable composition of at least one macromolecular organic polymeric binder, the improvement being to better the resistance to cold flow of the layer by at least half of the binder component being cellulose acetate butyrate containing 44 to 50 weight percent butyryl groups, 5.0 to 8.5 weight percent acetyl groups and 0.5 to 1.0 weight percent hydroxyl groups, said layer being laminatible to a board, for imagewise exposure and solvent development to form a resist image on said board.

2. An element according to claim 1 wherein the ethylenically unsaturated compound (a) and the initiator (b) are present in amounts of 10 to 30 weight percent and 0.1 to 10 weight percent, respectively, based on the weight of the photopolymerizable composition.

3. An element according to claim 1 wherein the cellulose acetate butyrate binder contains 49.0 weight percent butyryl groups, 5.0 weight percent acetyl groups and 0.5 weight percent hydroxyl groups.

4. An element according to claim 1 wherein the ethylenically unsaturated compound is a polyfunctional acrylate or methacrylate.

5. An element according to claim 4 wherein the ethylenically unsaturated compound is pentaerythritol triacrylate.

6. An element according to claim 1 wherein the remainder of said binder component is at least one binder selected from the group consisting of acrylates, polyurethanes, polyesters, epoxides, polyvinyl compounds, synethetic rubbers, polyamides, polycarbonates, polyvinyl acetal, and polyformaldehydes.

* * * * *